(12) United States Patent
Huang et al.

(10) Patent No.: US 11,581,334 B2
(45) Date of Patent: Feb. 14, 2023

(54) COCKTAIL LAYER OVER GATE DIELECTRIC LAYER OF FET FERAM

(71) Applicant: Taiwan Semiconductor Manufacturing Co., Ltd., Hsinchu (TW)

(72) Inventors: Rainer Yen-Chieh Huang, Hsinchu (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/168,342

(22) Filed: Feb. 5, 2021

(65) Prior Publication Data

US 2022/0254793 A1 Aug. 11, 2022

(51) Int. Cl.
*H01L 27/11* (2006.01)
*H01L 29/51* (2006.01)
*H01L 27/1159* (2017.01)
*H01L 29/78* (2006.01)
*H01L 21/28* (2006.01)
*H01L 29/66* (2006.01)
*H01L 23/522* (2006.01)

(52) U.S. Cl.
CPC ...... *H01L 27/1159* (2013.01); *H01L 23/5226* (2013.01); *H01L 29/40111* (2019.08); *H01L 29/516* (2013.01); *H01L 29/6684* (2013.01); *H01L 29/78391* (2014.09)

(58) Field of Classification Search
CPC ............. H01L 27/1159; H01L 23/5226; H01L 29/40111; H01L 29/516; H01L 29/6684; H01L 29/78391

USPC .......................................................... 257/295
See application file for complete search history.

(56) References Cited

U.S. PATENT DOCUMENTS

| | | | |
|---|---|---|---|
| 2005/0184316 A1* | 8/2005 | Kim .................. | H01L 29/66795 257/213 |
| 2005/0199881 A1* | 9/2005 | Hoffman ............. | H01L 29/7869 257/72 |
| 2005/0285226 A1* | 12/2005 | Lee ..................... | H01L 27/0688 257/532 |

(Continued)

OTHER PUBLICATIONS

Hasegawa, Masakatsu. "Ellingham Diagram." Treatise on Process Metallurgy, vol. 1, published in 2014.

(Continued)

*Primary Examiner* — Sheikh Maruf
(74) *Attorney, Agent, or Firm* — Eschweiler & Potashnik, LLC

(57) ABSTRACT

In some embodiments, the present disclosure relates to an integrated chip that includes a gate electrode arranged over a substrate. A gate dielectric layer is arranged over the gate electrode, and an active structure is arranged over the gate dielectric layer. A source contact and a drain contact are arranged over the active structure. The active structure includes a stack of cocktail layers alternating with first active layers. The cocktail layers include a mixture of a first material and a second material. The first active layers include a third material that is different than the first and second materials. The bottommost layer of the active structure is one of the cocktail layers.

20 Claims, 16 Drawing Sheets

(56) References Cited

U.S. PATENT DOCUMENTS

| | | | |
|---|---|---|---|
| 2006/0024975 A1* | 2/2006 | Ahn | H01L 21/02189 438/778 |
| 2006/0033145 A1* | 2/2006 | Kakoschke | H01L 29/8616 257/E29.171 |
| 2006/0038242 A1* | 2/2006 | Hsu | H01L 29/516 257/407 |
| 2006/0060857 A1* | 3/2006 | Mardilovich | H01L 21/3185 257/E29.151 |
| 2006/0073706 A1* | 4/2006 | Li | H01L 21/31116 257/E21.252 |
| 2006/0097345 A1* | 5/2006 | Marr | G11C 17/16 257/E29.268 |
| 2006/0097360 A1* | 5/2006 | Wu | H01L 23/5329 257/642 |
| 2006/0113565 A1* | 6/2006 | Abe | H01L 29/7869 257/197 |
| 2006/0183274 A1* | 8/2006 | Carcia | H01L 21/02554 438/149 |
| 2006/0214231 A1* | 9/2006 | Shah | H01L 29/785 438/149 |
| 2007/0131142 A1* | 6/2007 | Borland | C04B 35/632 427/79 |
| 2009/0224234 A1* | 9/2009 | Kim | H01L 51/0537 257/E21.414 |
| 2010/0140611 A1* | 6/2010 | Itagaki | H01L 29/7869 257/E29.296 |
| 2010/0289024 A1* | 11/2010 | Ito | H01L 29/7869 257/E21.414 |
| 2011/0175081 A1* | 7/2011 | Goyal | C23C 14/086 257/43 |
| 2012/0326219 A1* | 12/2012 | Lu | H01L 27/10826 257/296 |
| 2013/0270619 A1* | 10/2013 | Schloesser | H01L 29/6684 257/295 |
| 2015/0236281 A1* | 8/2015 | Yahagi | H01L 51/0545 523/456 |
| 2016/0308019 A1* | 10/2016 | Migita | H01L 29/0847 |
| 2016/0336312 A1* | 11/2016 | Yan | H01L 29/40111 |
| 2017/0162702 A1* | 6/2017 | Hu | H01L 29/42384 |
| 2018/0123064 A1* | 5/2018 | Choi | H01L 51/0002 |
| 2021/0398993 A1* | 12/2021 | Haratipour | H01L 27/11507 |

OTHER PUBLICATIONS

Kwon et al. "Recent Progress in High Performance and Reliable n-type Transition Metal Oxide-Based Thin Film Transistors." Semicond. Sci. Technol. 30 (2015) 024002 (16pp), published on Jan. 19, 2015.

Beneq. "How ALD Works." The date of publication is unknown. Retrieved online on Dec. 11, 2020 from https://beneq.com/en/technology/ald/.

Kahraman, Aysegul. "Understanding of post deposition annealing and substrate temperature effects on structural and electrical properties of Gd2O3 MOS capacitor." Journal of Materials Science: Materials in Electronics vol. 29, pp. 7993-8001(2018), published on Feb. 22, 2018.

Sundqvist, Jonas "Entegris launch Fluorine-Free Tungsten (FFW) for 3D NAND." BALD Engineering, published on Aug. 27, 2016.

McCormick, Abraham. "Thin Film System TFS 500. Advanced tool for advanced ALD research." Published, Dec. 2007.

Wikipedia.org. "Atomic layer deposition." Published on Nov. 29, 2020.

Wikipedia.org "Fe FET" Published on Nov. 28, 2020.

Wikipedia.org. "Indium gallium zinc oxide" Published on Sep. 21, 2020.

Zan et al. "Achieving High Field-Effect Mobility in Amorphous Indium-Gallium-Zinc Oxide by Capping a Strong Reduction Layer." Adv. Mater. 2012, 24, 3509-3514, published on Jun. 8, 2012.

Onaya et al. "Improvement in ferroelectricity of HfxZr1—xO2 Thin Films Using Top and Bottom ZrO2 Nucleation Layers." APL Mater. 7, 061107 (2019); doi: 10.1063/1.5096626, published on Jun. 27, 2019.

Onaya et al. "Improvement in Ferroelectricity of HfxZr1%xO2 Thin Films Using ZrO2 Seed Layer." Applied Physics Express 10, 081501 (2017), published on Jul. 13, 2017.

Robertson, J. "Band structures and band offsets of high K dielectrics on Si" Applied Surface Science 190 !2002) 2±10, published in 2002.

Hays et al. "Energy band offsets of dielectrics on InGaZnO4" Applied Physics Reviews 4, 021301 (2017), published on Apr. 18, 2017.

Hays et al. "Band offsets in HfSiO4/IGZO heterojunctions" J. Vac. Sci. Technol. B 33(6), Nov./Dec. 2015, published on Nov. 19, 2015.

Hays et al. "Effect of deposition conditions and composition on band offsets in atomic layer deposited HfxSi1-xOy on InGaZnO4" J. Vac. Sci. Technol. B 35(1), Jan./Feb. 2017, published on Jan. 11, 2017.

Materlik et al. "The Origin of Ferroelectricity in HfxZr1-xO2: A Computational Investigation and a Surface Energy Model" Journal of Applied Physics 117, 134109 (2015), published on Apr. 7, 2015.

Dogan et al. "Causes of ferroelectricity in HfO2-based thin films: An ab initio perspective" Physical Chemistry Chemical Physics— May 2019, published on May 29, 2019.

Estandía et al. "Engineering Ferroelectric Hf0.5Zr0.5O2 Thin Films by Epitaxial Stress" ACS Applied Electronic Materials, 1, 1449 (2019), published on Jul. 3, 2019.

Huang et al. "Performance tuning of InGaZnO thin-film transistors with a SnInGaZnO electron barrier layer." Applied Physics Letters 102, 092108 (2013), published on Mar. 8, 2013.

Takechi et al. "Depth-profiling XPS analysis of He-plasma treated amorphous InGaZnO thin films for use in top-gate coplanar thin-film transistors" Japanese Journal of Applied Physics 58, 038005 (2019), published on Feb. 11, 2019.

U.S. Appl. No. 17/168,361, filed Feb. 5, 2021.

U.S. Appl. No. 17/319,461, filed May 13, 2021.

\* cited by examiner

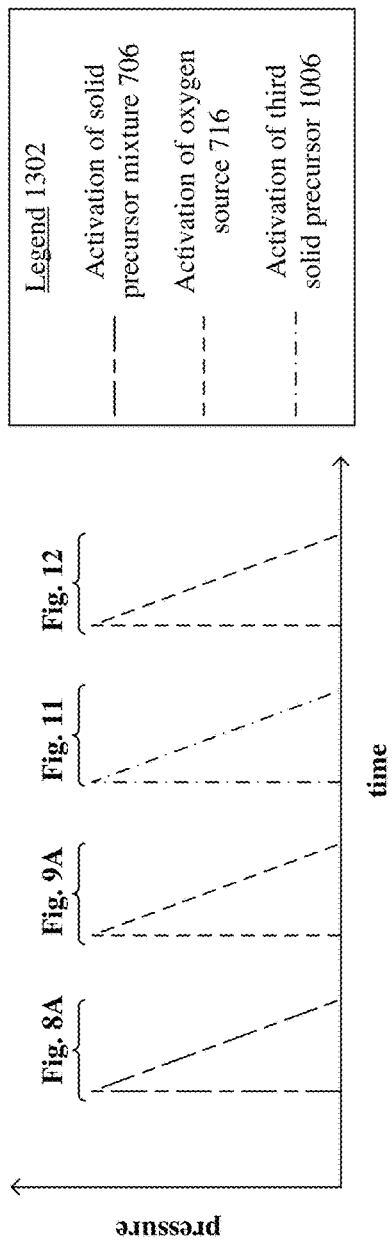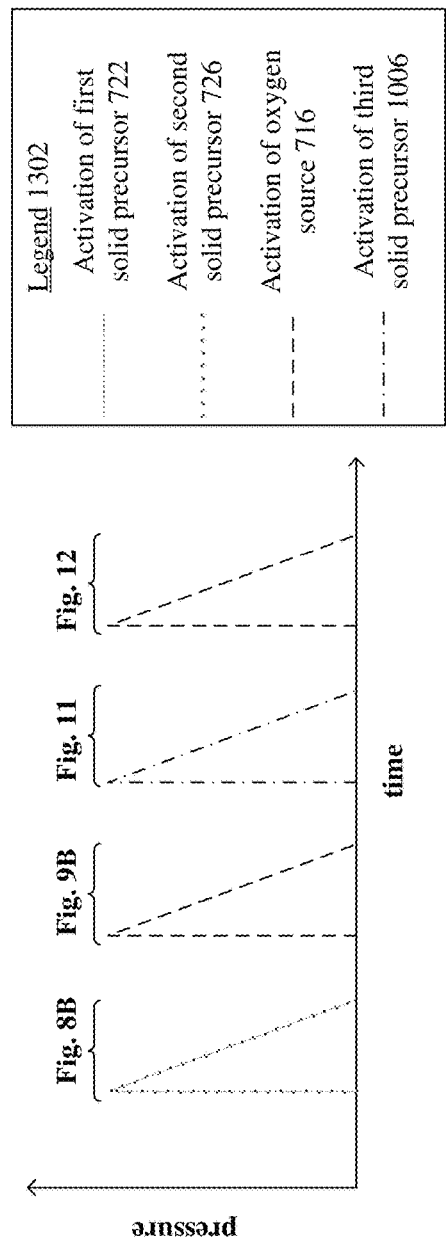

COCKTAIL LAYER OVER GATE DIELECTRIC LAYER OF FET FERAM

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic and thin film transistor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-15 illustrate various views and schematics of some embodiments of methods to form a cocktail layer on a ferroelectric layer of a FET FeRAM.

DETAILED DESCRIPTION

Figure 1:
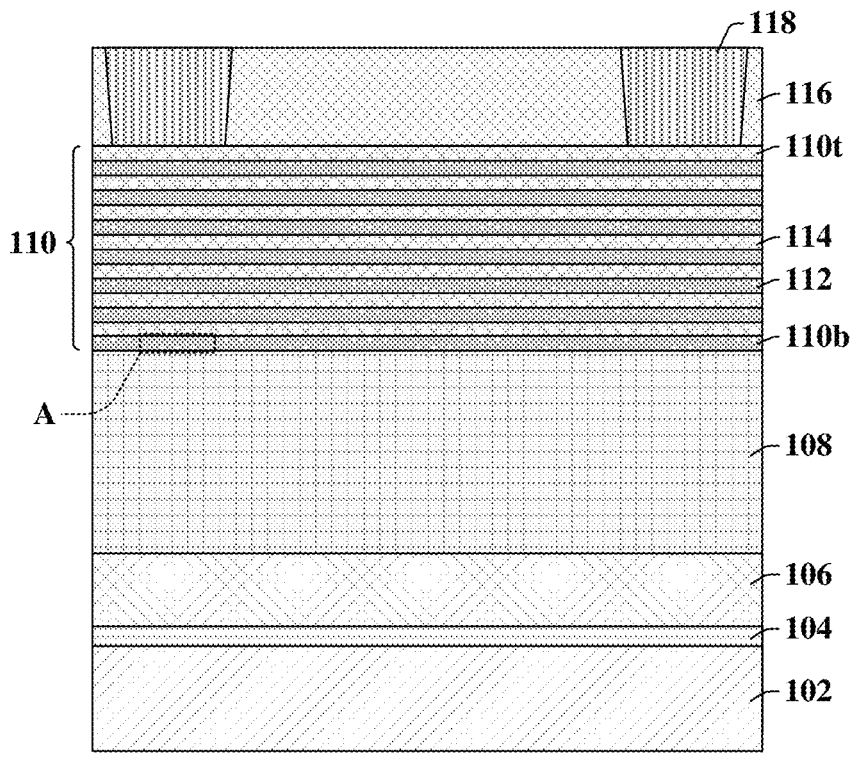
FIG. 1 illustrates a cross-sectional view of some embodiments of a field effect transistor (FET) ferroelectric random access memory (FeRAM) device comprising a cocktail layer directly on a ferroelectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A thin film transistor (TFT) is a type of field effect transistor (FET) that includes an active layer that may be turned "ON" such that mobile charge carriers flow through the active layer when a sufficient signal (e.g., voltage, current) is applied to source contact, drain contact, and gate electrode of the TFT. In some instances, the active layer comprises a semiconductor material that is transparent such as, for example, indium gallium zinc oxide (IGZO), amorphous silicon, or some other suitable material for use in optical applications. In a bottom gate TFT, the gate electrode is arranged below the active layer and the source and drain contacts are arranged over the active layer. A gate dielectric layer may separate the gate electrode from the active layer. In some instances, the gate dielectric layer comprises a ferroelectric material, such that the TFT functions as a FET ferroelectric random access memory (FeRAM). The ferroelectric layer can store data values based on a process of reversible switching between polarizations states because the ferroelectric's crystal structure changes when an electric field is present.

To form a FET FeRAM, a ferroelectric layer is formed over a gate electrode. Then, the active layer is formed over the ferroelectric layer, and source and drain contacts are formed over the active layer. In some embodiments, the active layer comprises multiple layers of materials that have different optimal properties when disposed directly on the ferroelectric layer. For example, when the active layer comprises IGZO, a layer of gallium oxide may be formed directly on the ferroelectric layer because gallium oxide has a high bonding energy which reduces defects (e.g., oxygen vacancies). With a reduction in defects (e.g., oxygen vacancies), less positive or negative charges, known as surface states, will be created within the active layer and/or ferroelectric layer, thereby reducing reliability concerns. However, a reduction in defects (e.g., oxygen vacancies) also reduces charge mobility in the layer of gallium oxide. So, in some other embodiments, a layer of indium oxide, which has a higher mobility than gallium oxide, is formed directly on the ferroelectric layer to increase the switching speed of the FET FeRAM. However, reliability is reduced when indium oxide is formed directly on the ferroelectric layer because more surface states are formed compared to that of gallium oxide.

Various embodiments of the present disclosure relate to forming an active structure over a ferroelectric layer of a FET FeRAM, wherein the active structure comprises a cocktail layer arranged directly on the ferroelectric layer to increase charge mobility while also decreasing surface states of the ferroelectric layer and/or cocktail layer. The cocktail layer comprises a mixture of a first material and a second material, wherein the first material has a stronger bonding energy compared to the second material to reduce surface states, and wherein the second material has a higher charge mobility compared to the first material to increase switching speeds. In some embodiments, the cocktail layer is formed by activating precursors of the first and second materials at the same time within a same reaction chamber. Thus, the cocktail layer is formed directly on the ferroelectric layer such that the first and second materials contact the ferroelectric layer to optimize switching speeds and reliability of the FET FeRAM.

FIG. 1 illustrates a cross-sectional view 100 of some embodiments of a field effect transistor (FET) ferroelectric random access memory (FeRAM) device comprising a cocktail layer directly on a ferroelectric layer.

The cross-sectional view 100 of FIG. 1 includes a gate electrode 106 arranged over a substrate 102. In some embodiments, a dielectric layer 104 is arranged between the gate electrode 106 and the substrate 102. In some embodiments, a gate dielectric layer 108 is arranged over the gate electrode 106. In some embodiments, the gate dielectric layer 108 comprises a ferroelectric material such as, for example, strontium bismuth tantalite, lead zirconate titanate, hafnium zinc oxide, hafnium zirconium oxide, doped hafnium oxide, or the like. In such embodiments, the gate dielectric layer 108 comprising the ferroelectric material is configured to store data states by changing crystal structure orientations and thus, resistances upon exposure to different voltage biases.

In some embodiments, an active structure 110 is arranged over the gate dielectric layer 108. In some embodiments, the active structure 110 comprises a semiconductor material that can be turned "ON" to form a channel region of mobile charge carriers when a sufficient voltage bias is applied across the active structure 110. The channel region of mobile charge carriers can be controlled to read data from or write data to the gate dielectric layer 108. In some embodiments, a bottommost layer 110b of the active structure 110 comprises a cocktail layer 112 comprising a mixture of first and second materials, and a first active layer 114 comprising a third material different than the first and second materials is arranged over the cocktail layer 112. In some embodiments, the active structure 110 comprises a stack of the cocktail layers 112 and the first active layers 114 in alternating order. In some embodiments, a topmost layer 110t of the active structure 110 comprises one of the first active layers 114.

In some embodiments, source/drain contacts 118 are arranged over the active structure 110. In some embodiments, the source/drain contacts 118 are arranged within and extend through an interconnect dielectric layer 116 to contact the topmost layer 110t of the active structure 110.

In some embodiments, the first, second, and third materials of the active structure 110 are metal-oxides. In some embodiments, the third material of the first active layer 114 comprises a more crystalline material than the first and second materials. Thus, the first active layer 114 is spaced apart from direct contact with the gate dielectric layer 108 because otherwise, an interface between the third material of the first active layer 114 and the gate dielectric layer 108 would be too rough and have potential adhesion and structural issues on the gate dielectric layer 108.

In some embodiments, the first material of the cocktail layer 112 comprises a stronger or more negative bonding energy than the second material. In some embodiments, the bonding energy may be determined from a metal oxide Ellingham diagram, which illustrates the Gibbs free energy of formation versus temperature for various metal-oxides. In some embodiments, the first material comprises gallium oxide, hafnium oxide, zirconium oxide, titanium oxide, aluminum oxide, tantalum oxide, strontium oxide, barium oxide, scandium oxide, magnesium oxide, lanthanum oxide, gadolinium oxide, or some other suitable metal oxide. In some embodiments, the second material comprises indium oxide, tin oxide, arsenic oxide, zinc oxide, or the like. In some embodiments, the third material comprises zinc oxide. Thus, for example, in some embodiments, the first material comprises gallium oxide; the second material comprises indium oxide; and the third material comprises zinc oxide, such that the active structure 110 comprises indium gallium zinc oxide (IGZO), which is a semiconducting material. In some other embodiments, the active structure 110 may comprise tin gallium zinc oxide, indium hafnium zinc oxide, or some other suitable combination of the first, second, and third materials that together form a semiconducting material.

Because the first material has a stronger bonding energy, less defects (e.g., oxygen vacancies) and thus, less surface states (i.e., excess charges) are present at an interface between the first material of the cocktail layer 112 and the gate dielectric layer 108. In some embodiments, the second material of the cocktail layer has a higher mobility than the first material of the cocktail layer 112 due to a weaker bond energy and an increase in metal ions in the second material. Thus, mobile charge carriers may have a higher mobility at an interface between the second material of the cocktail layer 112 and the gate dielectric layer 108.

For these reasons, the cocktail layer 112 comprises a mixture of the first and second materials to reduce defects but also increase charge mobility at an interface between the bottommost layer 110b of the active structure 110 and the gate dielectric layer 108 to increase the reliability and switching speeds of the FET FeRAM.

Figure 2:
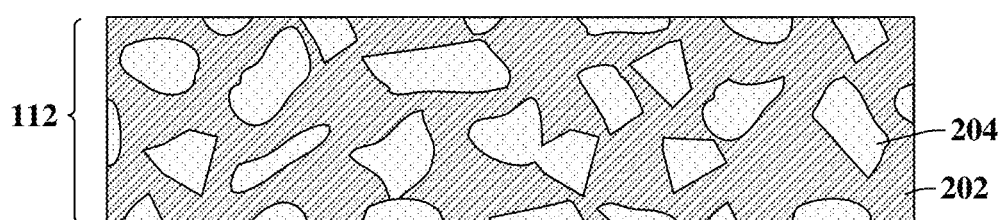
FIG. 2 illustrates a magnified, cross-sectional view of some embodiments of the microstructure of the cocktail layer.

FIG. 2 illustrates a magnified, cross-sectional view 200 of some embodiments of the microstructure of the cocktail layer. The cross-sectional view 200 may correspond to box A of FIG. 1.

As shown in cross-sectional view 200, in some embodiments, the cocktail layer 112 comprises first material regions 202 and second material regions 204. In some embodiments, the second material regions 204 appear to be embedded within the first material regions 202. In other embodiments, the first material regions 202 may appear to be embedded within the second material regions 204. Nevertheless, in some embodiments, the cocktail layer 112 includes a mixture of the first and second materials, and the magnified, cross-sectional view 200 may exhibit defined first material regions 202 comprising the first material and second material regions 204 comprising the second material.

In some such embodiments, the first material regions 202 are substantially amorphous, and the second material regions 204 are substantially amorphous. With the first and second material regions 202, 204 being amorphous, roughness and electron scattering are reduced at the interface between the cocktail layer 112 and the gate dielectric layer (108 of FIG. 1). Further in some embodiments, because the first material regions 202 and the second material regions 204 directly contact the gate dielectric layer (108 of FIG. 1), defects are reduced and charge mobility is increased which increases the "ON" current and the switching speeds of the FET FeRAM.

Figure 3A:
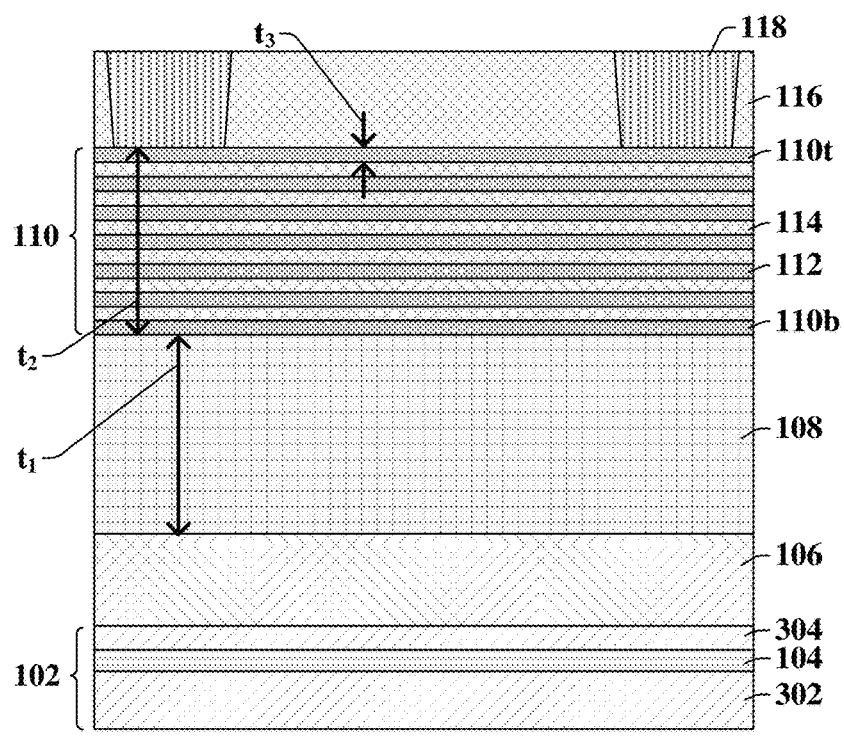
FIGS. 3A and 3B illustrate cross-sectional views of some alternative embodiments of a FET FeRAM comprising a cocktail layer directly on a ferroelectric layer.

FIG. 3A illustrates a cross-sectional view 300A of some alternative embodiments of a FET FeRAM comprising a cocktail layer directly on a ferroelectric layer.

In some embodiments, the substrate 102 comprises a silicon on insulator substrate such that the dielectric layer 104 is arranged between a bulk substrate layer 302 and an active substrate layer 304. In some embodiments, the topmost layer 110t of the active structure 110 comprises one of the cocktail layers 112. Further, it will be appreciated that the active structure 110 may comprise more or less layers than what is illustrated in FIG. 3A.

In some embodiments, the gate dielectric layer 108 has a first thickness $t_1$ in a range of between, for example, approximately 5 nanometers and approximately 20 nanometers. In some embodiments, the active structure 110 may have a second thickness $t_2$ in a range of between, for example, approximately 5 nanometers and approximately 15 nanometers. In some embodiments, each cocktail layer 112 has a third thickness $t_3$ in a range of between, for example, approximately 0.1 angstroms to approximately 500 angstroms. In some embodiments, a ratio of the first material to the second material ranges from approximately 0.1 to approximately 0.99 in the cocktail layer 112. In some embodiments, the gate electrode 106 may comprise, for example, titanium nitride, aluminum, tungsten, copper, or some other suitable conductive material. In some embodiments, the gate electrode 106 may have a thickness in a range of between, for example, approximately 10 nanometers and approximately 20 nanometers. In some embodiments, the source/drain contacts 118 may comprise, for example, aluminum, tungsten, copper, tantalum, titanium, or some other suitable conductive material.

Figure 3B:
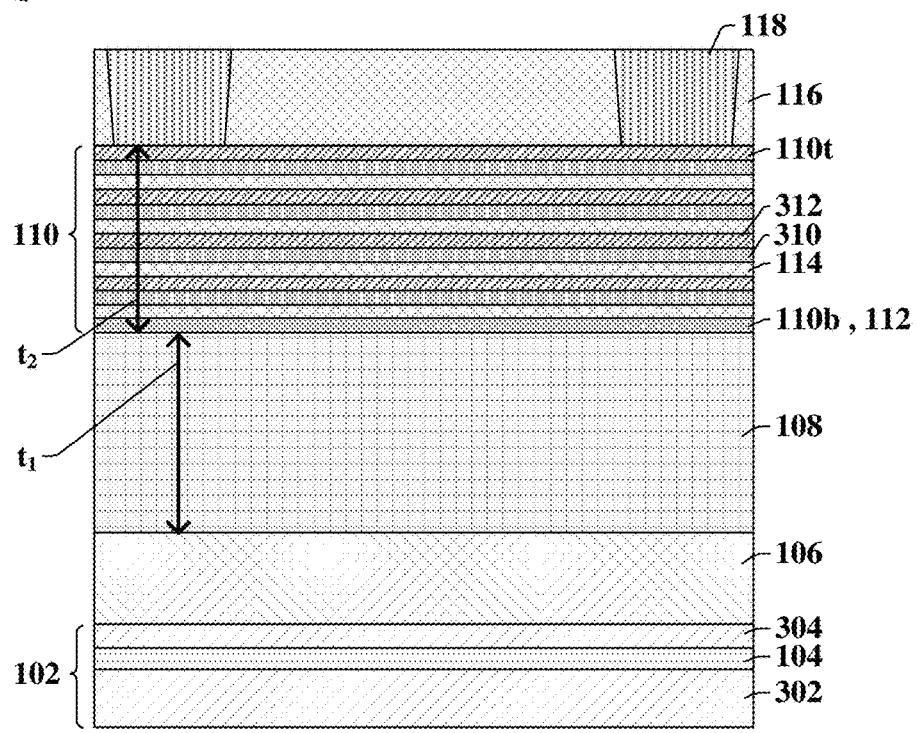

FIG. 3B illustrates a cross-sectional view 300B of some other alternative embodiments of a FET FeRAM comprising a cocktail layer directly on a ferroelectric layer.

In some embodiments, the bottommost layer 110b of the active structure 110 comprises the cocktail layer 112. In some embodiments, the first active layer 114 comprising the third material is arranged over the cocktail layer 112. Then, in some embodiments, the active structure 110 further comprises a second active layer 310 arranged over the first active layer 114, and a third active layer 312 arranged over the second active layer 310. In some such embodiments, the second active layer 310 comprises the first material, and the third active layer 312 comprises the second material. Thus, in some embodiments, the cocktail layer 112 is formed directly on the gate dielectric layer 108, but all other layers of the active structure 110 comprise the first, second, and third active layers 114, 310, 312, which are homogenous layers and not layers comprising a mixture of materials. In some such embodiments, the active structure 110 comprises multiple ones of the first, second, and third active layers 114, 310, 312 arranged over the cocktail layer 112. In some embodiments, the topmost layer 110t of the active structure 110 may comprise the first, second, or third active layer 114, 310, 312.

Figure 4:
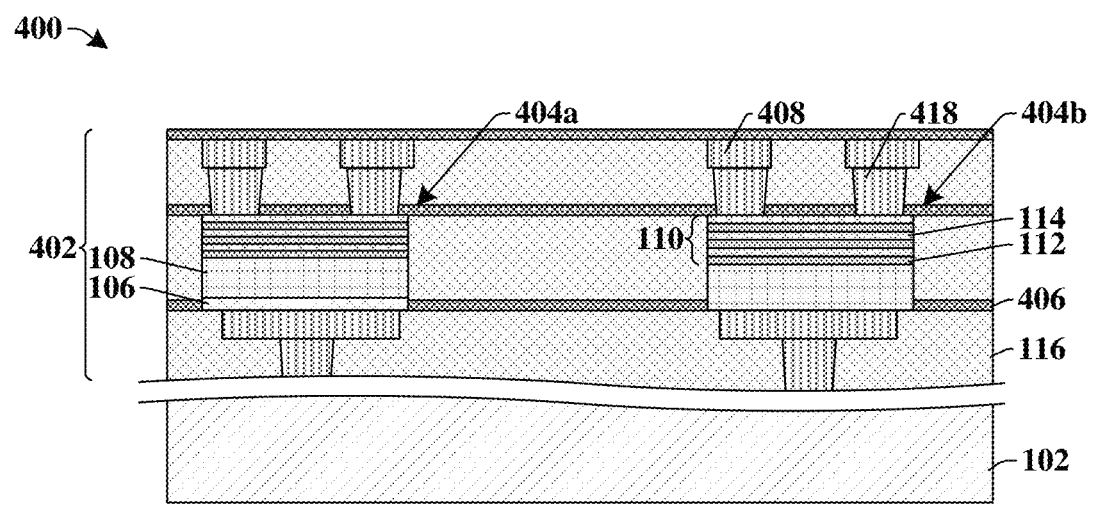
FIG. 4 illustrates a cross-sectional view of some embodiments of an integrated chip comprising a FET FeRAM embedded within an interconnect structure.

FIG. 4 illustrates a cross-sectional view 400 of some embodiments of an integrated chip comprising a FET FeRAM embedded within an interconnect structure.

In some embodiments, the FET FeRAM is arranged within an interconnect structure 402 that is arranged over the substrate 102. In some embodiments, the interconnect structure 402 comprises interconnect contacts 418 and interconnect wires 408 disposed within interconnect dielectric layers 116 and etch stop layers 406. In some embodiments, the interconnect contacts 418 and the interconnect wires 408 may comprise, for example, aluminum, tungsten, copper, tantalum, titanium, or some other suitable conductive material. In some embodiments, the interconnect dielectric layers 116 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the etch stop layers 406 may comprise, for example, silicon carbide, silicon nitride, or some other suitable dielectric material.

As shown in FIG. 4, a first FET FeRAM 404a and a second FET FeRAM 404b are arranged within the interconnect structure 402. In some embodiments, the interconnect contacts 418 are arranged over and coupled to the active structure 110 such that the interconnect contacts 418 serve as the source/drain contacts (118 of FIG. 3) of the FET FeRAM. In some embodiments, as shown with the first FET FeRAM 404a, the gate electrode 106 is arranged over one of the interconnect wires 408. In other embodiments, the gate electrode 106 may be arranged over one of the interconnect contacts 418. In some embodiments, as shown with the second FET FeRAM 404b, the gate electrode 106 is omitted, and instead, the gate dielectric layer 108 is arranged directly on one of the interconnect wires 408 of the interconnect structure 402.

In some embodiments, due to the small vertical dimensions of the FET FeRAMs (e.g., 404, 404b), the FET FeRAMs may be integrated into the interconnect structure 402 of an integrated chip and controlled by the network of interconnect wires 408 and interconnect contacts 418 of the interconnect structure 402 to store data within the gate dielectric layers 108.

FIGS. 5-15 illustrate various views and schematics 500-1500 of some embodiments of methods of forming a cocktail layer directly on a ferroelectric layer in a FET FeRAM to increase switching speeds and reliability of the FET FeRAM. Although FIGS. 5-15 are described in relation to a method, it will be appreciated that the structures disclosed in FIGS. 5-15 are not limited to such a method, but instead may stand alone as structures independent of the method.

Figure 5:
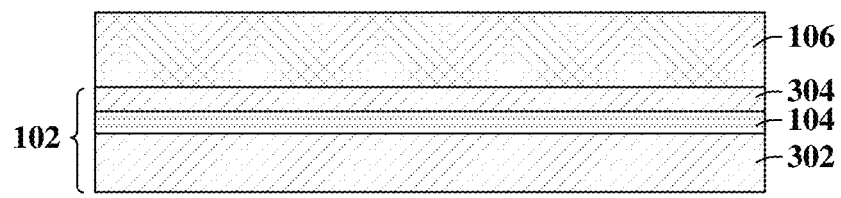

As shown in cross-sectional view 500 of FIG. 5, in some embodiments, a gate electrode 106 is formed over a substrate 102. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some other embodiments, the substrate 102 may comprise a support transparent material, such as a glass, for use in optical applications. In the cross-sectional view 500 of FIG. 5, the substrate 102 is a silicon-on-insulator (SOI) substrate comprising a dielectric layer 104 arranged over a bulk substrate layer 302 and arranged below an active substrate layer 304. In some such embodiments, the bulk substrate layer 302 and the active substrate layer 304 may comprise, for example, silicon, germanium, or some other suitable semiconductor material. In some embodiments, the dielectric layer 104 comprises silicon dioxide, silicon oxynitride, or some other suitable dielectric layer.

In some embodiments, the gate electrode 106 is formed over the substrate 102 by way of a deposition process (e.g., physical vapor deposition (PVD), chemical vapor deposition (CVD), atomic layer deposition (ALD), direct current sputtering, etc.). In some embodiments, the gate electrode 106 comprises titanium nitride, aluminum, tungsten, copper, or some other suitable conductive material. In some embodiments, the gate electrode 106 is formed to have a thickness in a range of between, for example, approximately 10 nanometers and approximately 20 nanometers.

Figure 6:
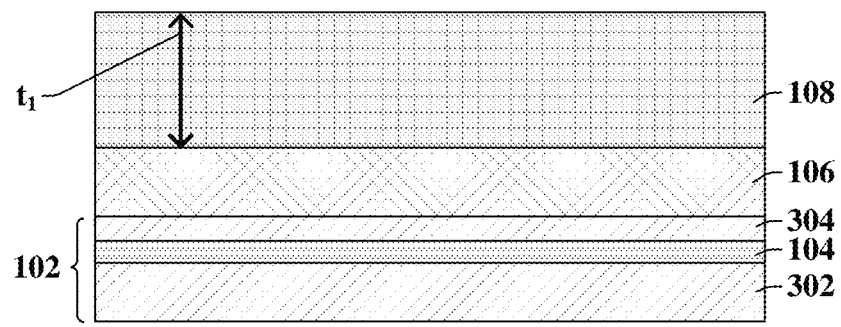

As shown in cross-sectional view 600 of FIG. 6, in some embodiments, a gate dielectric layer 108 is formed over the gate electrode 106. In some embodiments, the gate dielectric layer 108 is formed by atomic layer deposition in a chamber at a temperature in a range of between, for example, approximately 200 degrees Celsius and approximately 400 degrees Celsius. In some other embodiments, the gate dielectric layer 108 is formed by way of another deposition process (e.g., PVD, CVD, etc.). In some embodiments, the gate dielectric layer 108 comprises a ferroelectric material such as, for example, strontium bismuth tantalite, lead zirconate titanate, hafnium zinc oxide, hafnium zirconium oxide, doped hafnium oxide, or the like. For example, in some embodiments, the gate dielectric layer 108 comprises hafnium zirconium oxide, wherein an atomic ratio between hafnium and zirconium is approximately one to one. In some embodiments, the gate dielectric layer 108 has a first thickness $t_1$ that is in a range of between approximately 5 nanometers and approximately 20 nanometers.

Figure 7A:
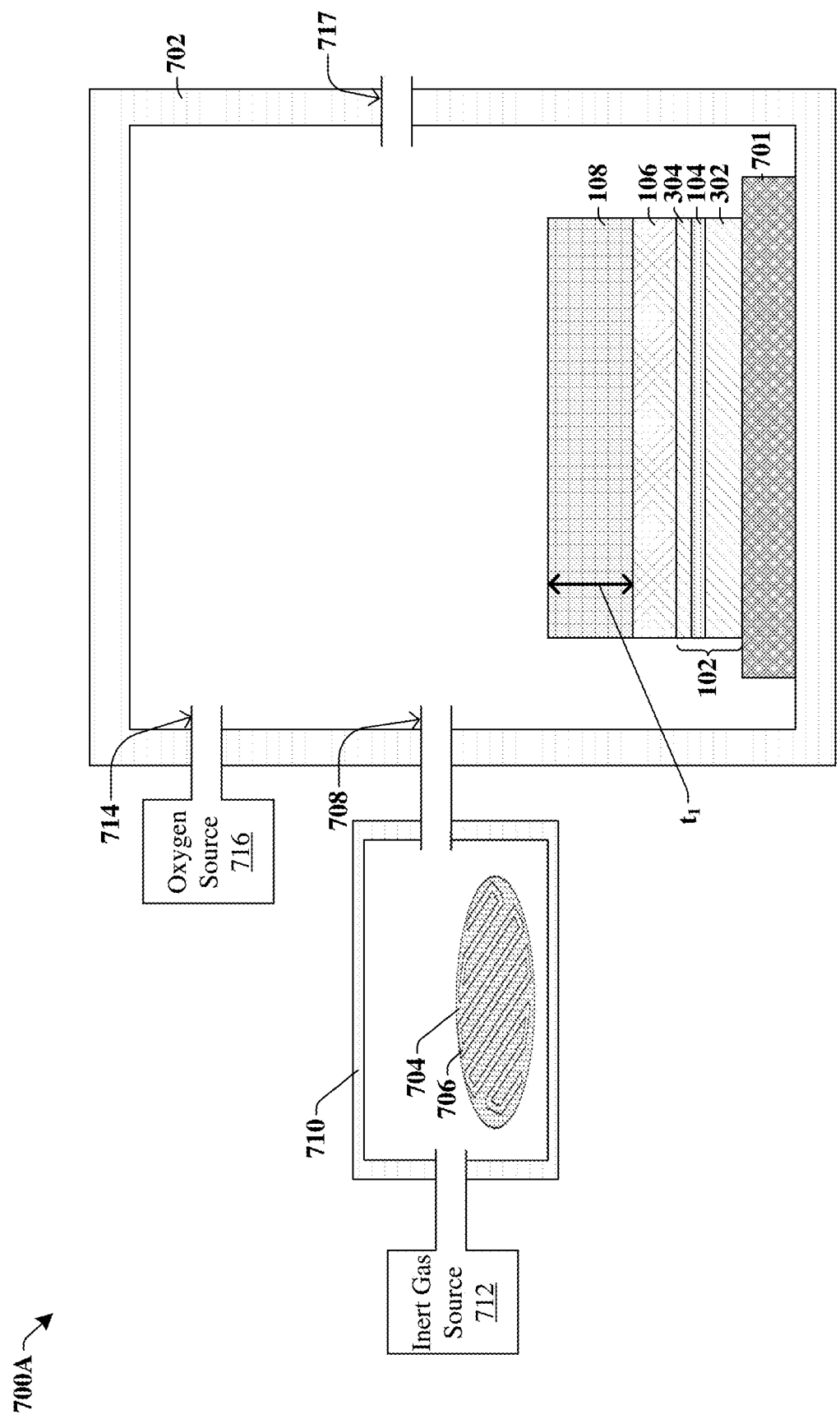

As shown in cross-sectional view 700A of FIG. 7A, in some embodiments, the substrate 102 is transferred onto a wafer chuck 701 within a reaction chamber defined by chamber housing 702. In some embodiments, the reaction chamber is an atomic layer deposition (ALD) chamber, low pressure vessel, and/or the like. In some embodiments, the substrate 102 was already in the reaction chamber during the formation of the gate electrode 106 and/or gate dielectric layer 108 formed in FIGS. 5 and 6, respectively. In some embodiments, a first gas inlet line 708 passes through the chamber housing 702 such that a first precursor vessel defined by first vessel housing 710 is coupled to the reaction chamber through the first gas inlet line 708. In some embodiments, a second gas inlet line 714 passes through the chamber housing 702 such that an oxygen source 716 can enter the reaction chamber. In some embodiments, a gas outlet line 717 passes through the chamber housing 702 such that various gases can exit the reaction chamber during deposition processes.

In some embodiments, a first precursor plate 704 is arranged within the first precursor vessel. In some embodiments, the first precursor plate 704 comprises a solid precursor mixture 706 within grooves of the first precursor plate 704. In some embodiments, an inert gas source 712 is coupled to the first precursor vessel such that when the inert gas source 712 is turned "ON," the inert gas may react with the solid precursor mixture 706, and a precursor vapor may enter the reaction chamber through the first gas inlet line 708 to form a layer from the precursor vapor on the gate dielectric layer 108.

In some embodiments, the solid precursor mixture 706 comprises a first precursor mixed with a second precursor, wherein the first precursor corresponds to a first material to be deposited onto the gate dielectric layer 108, and wherein the second precursor corresponds to a second material to be deposited onto the gate dielectric layer 108. Thus, upon activation of the solid precursor mixture 706, a cocktail layer (e.g., 112 in FIG. 10A) comprising a mixture of the first and second materials may be deposited on the gate dielectric layer 108. In some embodiments, the first material comprises gallium, hafnium, zirconium, titanium, aluminum, tantalum, strontium, barium, scandium, magnesium, lanthanum, gadolinium, or some other suitable metal. In some embodiments, wherein the first material comprises gallium, the first precursor of the solid precursor mixture 706 may comprise, for example, $Ga(C_2H_5)_3$, $Ga(NMe)_3$, $Ga(C_5H_7O_2)_3$, GaCp*, $Ga(CH_3)_3$, $Ga_2(NMe_2)_6$, or some other suitable solid precursor comprising gallium.

In some embodiments, the second material comprises indium, tin, zinc, arsenic, or some other suitable metal. In some such embodiments, wherein the second material comprises indium, the second precursor of the solid precursor mixture 706 may comprise, for example, trimethyl-indium, triethyl-indium, $InCp(C_5H_5In)$, $InCA-1(C_8H_{24}InNSi_2)$, $DADI(C_7H_{18}InN)$, or some other suitable solid precursor comprising indium. In some embodiments, a ratio of the first precursor to the second precursor in the solid precursor mixture 706 may be in a range of between, for example, about 0.01 and about 0.99.

Figure 7B:
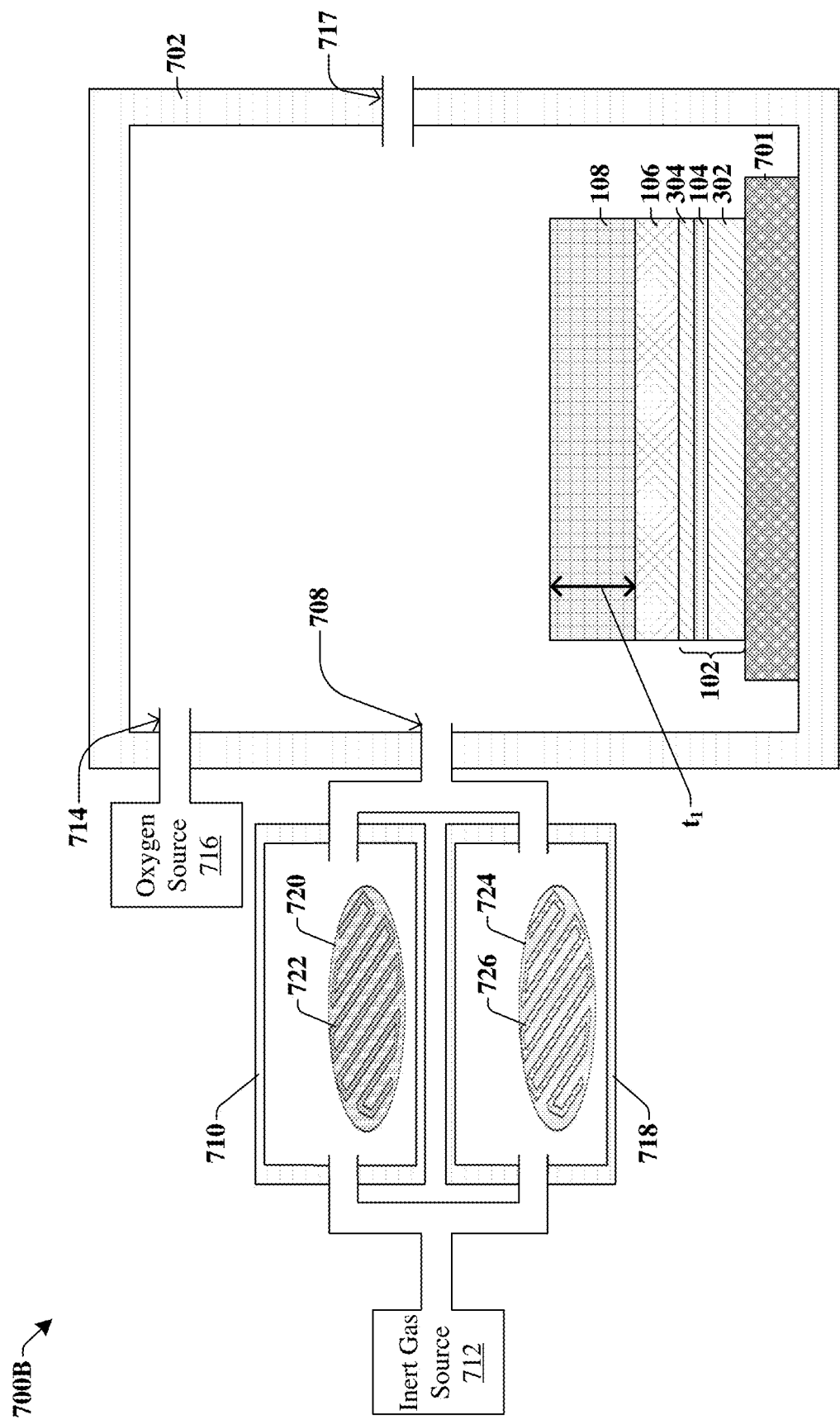

FIG. 7B illustrates cross-sectional view 700B of some other embodiments of a reaction chamber defined by chamber housing 702. In some other embodiments, the substrate 102 is transferred into the chamber housing 702 of FIG. 7B instead of the chamber housing 702 of FIG. 7A.

It will be appreciated that two different methods for deposition of a cocktail layer will be illustrated in FIGS. 7A-9B. The first method, comprising a solid precursor mixture (706 of FIG. 7A) will be illustrated in the "A" figures (i.e., FIGS. 7A, 8A, 9A). The second method, comprising a first solid precursor 722 and a second solid precursor 726 will be illustrated in the "B" figures (i.e., FIGS. 7B, 8B, 9B). Thus, in some embodiments, a first method to deposit a cocktail layer over the gate dielectric layer 108 follows FIGS. 7A, 8A, and 9A, whereas a second method to deposit a cocktail layer over the gate dielectric layer 108 follows FIGS. 7B, 8B, and 9B.

As shown in the cross-sectional view 700B of FIG. 7B, in some embodiments, a second precursor vessel defined by a second vessel housing 718 is also coupled to reaction chamber defined by the chamber housing 702. In some such embodiments, the inert gas source 712 is coupled to the first and second precursor vessels. In some other embodiments, each of the first and second precursor vessels are coupled to and controlled by individual gas sources. In some embodiments, a second precursor plate 720 is arranged within the first precursor vessel and comprises a first solid precursor 722. In some embodiments, the first solid precursor 722 comprises the first precursor as described above with respect to FIG. 7A. In some embodiments, a third precursor plate 724 is arranged within the second precursor vessel and comprises a second solid precursor 726. In some embodiments, the second solid precursor 726 comprises the second precursor as described above with respect to FIG. 7A.

In some such embodiments, the inert gas source 712 is coupled to the first and second precursor vessels such that when the inert gas source 712 is turned "ON," the inert gas may react with the first solid precursor 722 and the second solid precursor 726 at the same time, and a precursor vapor may from within the reaction chamber to form a layer from the precursor vapor on the gate dielectric layer 108. In some other embodiments (not shown), a first inert gas source and a second inert gas source coupled to the first precursor vessel and the second precursor vessel may be turned "ON" at the same time such that precursor vapors from the first and second precursor vessel enter the reaction chamber through the first gas inlet line 708 to form a layer from the precursor vapor on the gate dielectric layer 108.

Figure 8A:
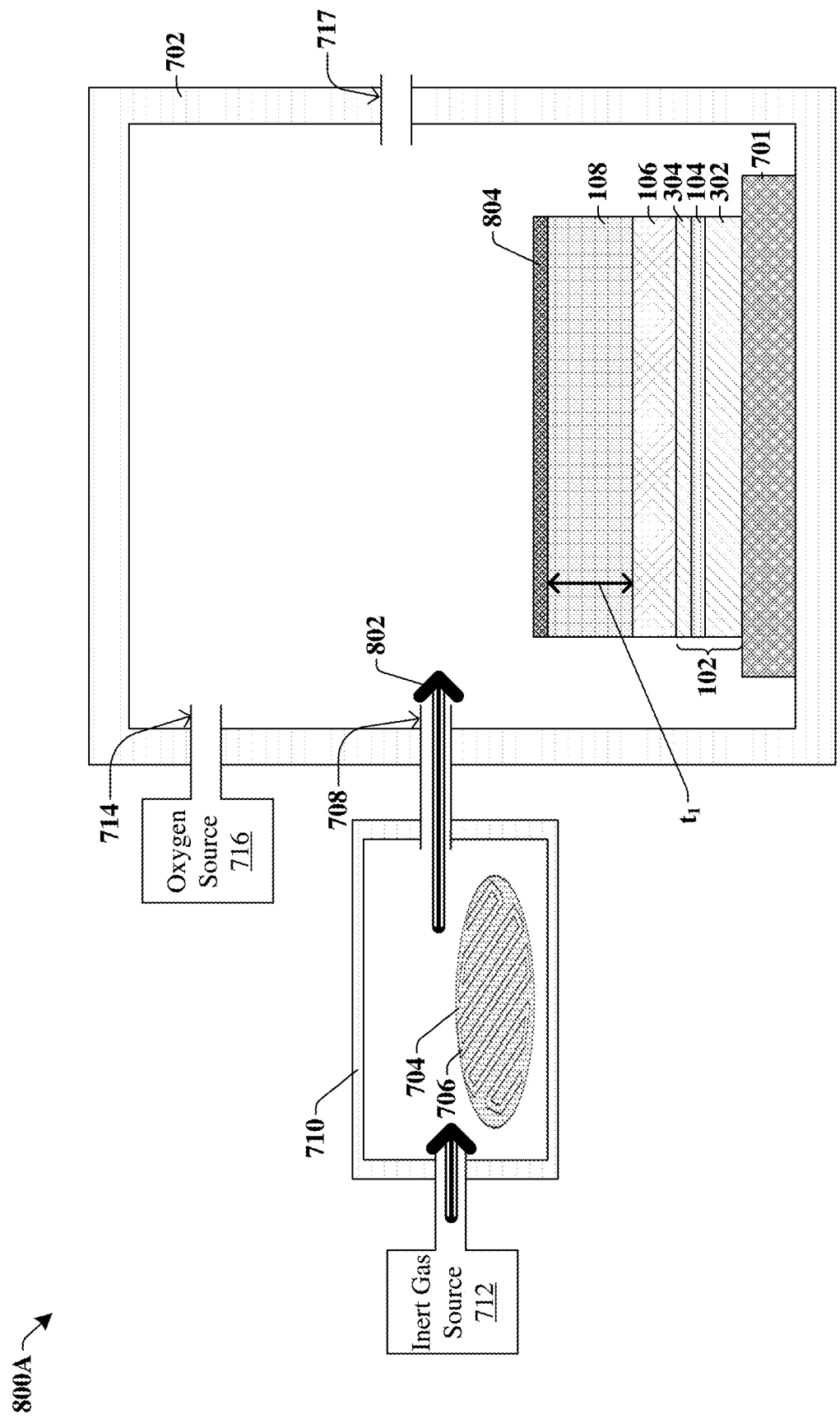

As shown in cross-sectional view 800A of FIG. 8A, in some embodiments, the inert gas source 712 is turned "ON," as indicated by arrows 802, and reacts with the solid precursor mixture 706 within the first precursor vessel. In some such embodiments, a precursor vapor forms and enters the reaction chamber to form a first metal layer 804 comprising a mixture of two metals arranged over the gate dielectric layer 108 by ALD. In some embodiments, the inert gas source 712 comprises, for example, nitrogen gas, argon gas, hydrogen gas, a combination thereof, or some other suitable gas.

Figure 8B:
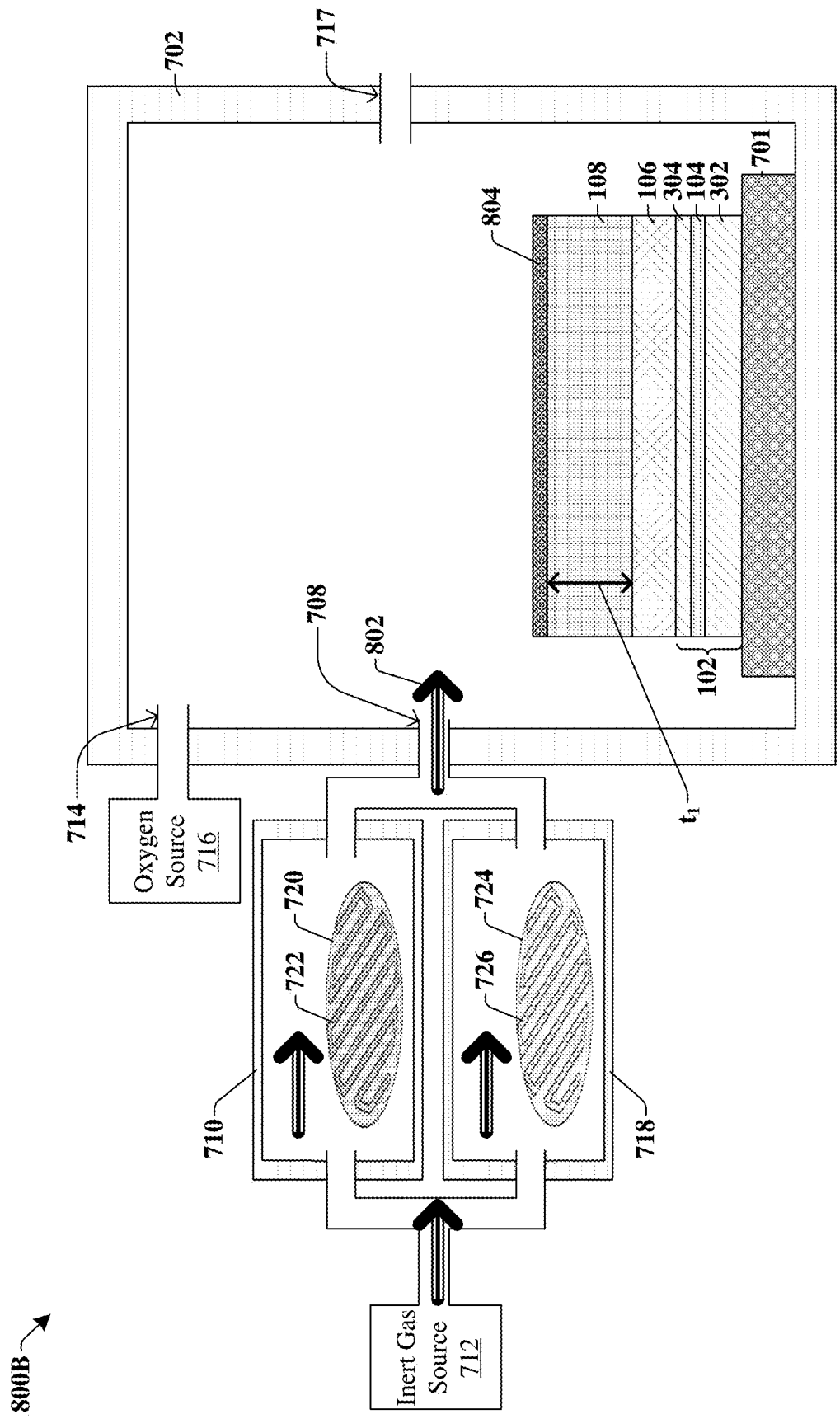

As shown in cross-sectional view 800B of FIG. 8B, in some embodiments, the inert gas source 712 is turned "ON," as indicated by arrows 802, and reacts with the first solid precursor 722 and the second solid precursor 726 and a first precursor vapor from the first solid precursor 722 and a second precursor vapor from the second solid precursor enter and mix within the reaction chamber. In some such embodiments, the first and second precursor vapors mix within the reaction chamber to form the first metal layer 804 comprising a mixture of two metals arranged over the gate dielectric layer 108 by ALD.

Figure 9A:
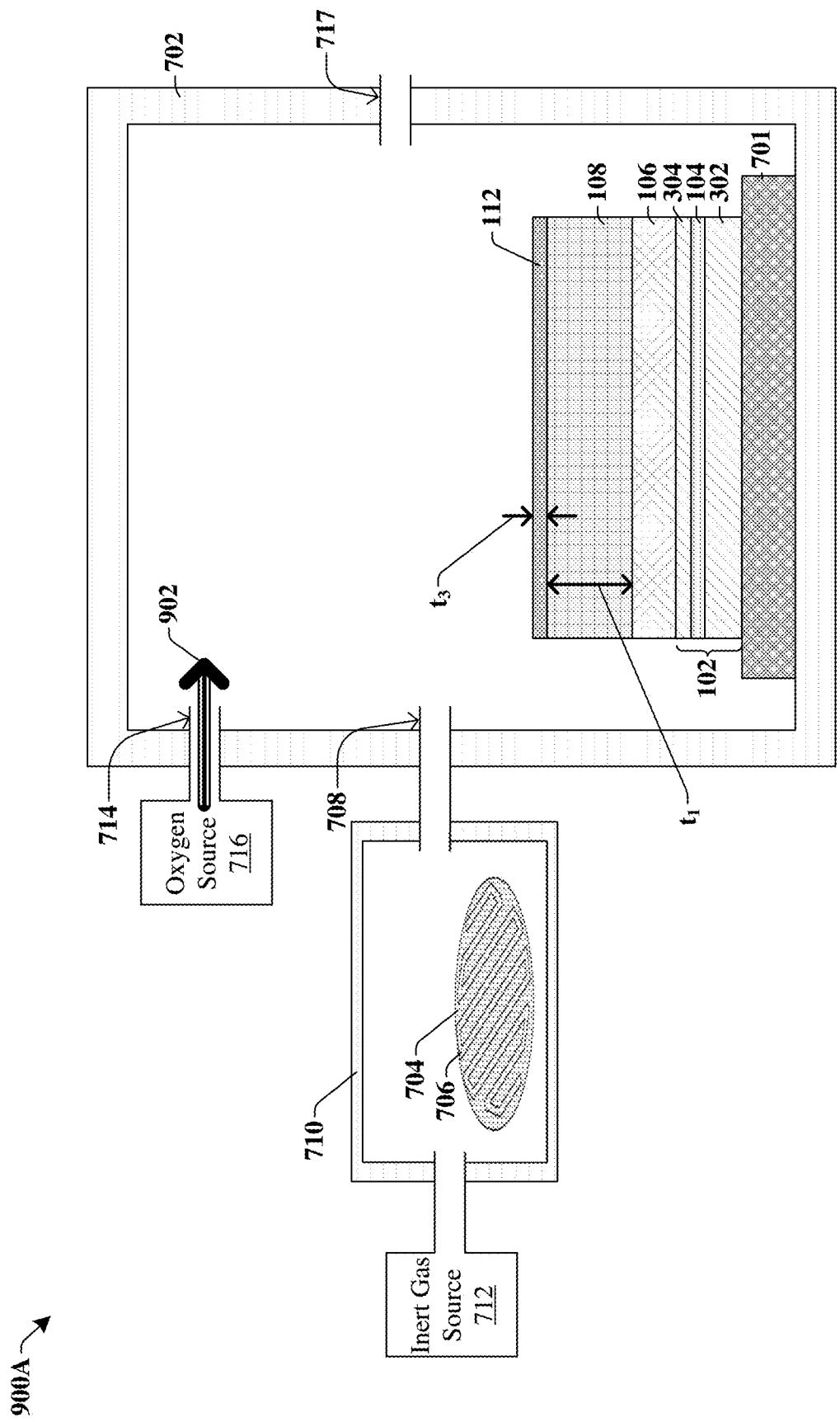
Figure 9B:
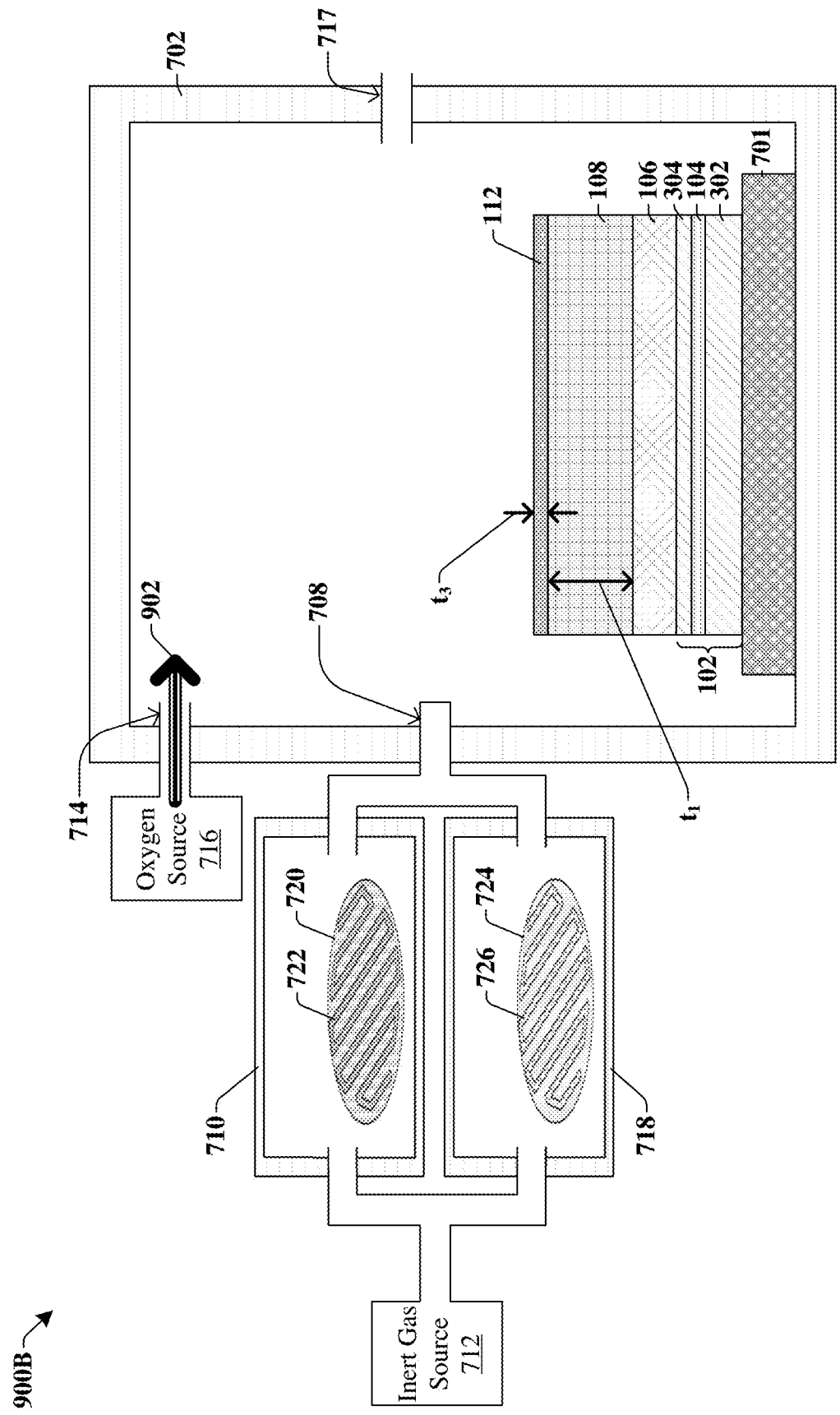

As shown in cross-sectional views 900A and 900B of FIGS. 9A and 9B, respectively, in some embodiments, the oxygen source 716 is turned "ON," as indicated by arrow 902, and an oxygen vapor enters the reaction chamber. In some such embodiments, the oxygen vapor then reacts with the first metal layer (804 of FIG. 8A or 8B) to oxidize the first metal layer (804 of FIG. 8A or 8B) and form a cocktail layer 112 over the gate dielectric layer 108. In some embodiments, the oxygen source 716 is water, for example. In some other embodiments, the precursor vapor of FIG. 7A or 7B enters the reaction chamber and then the oxygen vapor enters the reaction chamber and reacts with the precursor vapor to form the cocktail layer 112, thereby bypassing the formation of the first metal layer (804 of FIG. 8A or 8B).

Nevertheless, in some embodiments, the cocktail layer 112 comprises a mixture of the first material and a second material, wherein the first and second materials are metal oxides. In some embodiments, the first material of the cocktail layer 112 comprises a stronger or more negative bonding energy than the second material. In some embodiments, the first material comprises gallium oxide, hafnium oxide, zirconium oxide, titanium oxide, aluminum oxide, tantalum oxide, strontium oxide, barium oxide, scandium oxide, magnesium oxide, lanthanum oxide, gadolinium oxide, or some other suitable metal oxide. In some embodiments, the second material comprises indium oxide, tin oxide, arsenic oxide, zinc oxide, or the like.

In some embodiments, the cocktail layer 112 has a third thickness $t_3$ in a range of between, for example, approximately 0.1 angstroms to approximately 500 angstroms. In some embodiments, a ratio of the first material to the second material in the cocktail layer 112 ranges from approximately 0.1 to approximately 0.99.

Because the first material has a stronger bonding energy, less defects (e.g., oxygen vacancies) and thus, less surface states (i.e., excess charges) are present at an interface between the first material of the cocktail layer 112 and the gate dielectric layer 108. In some embodiments, the second material of the cocktail layer has a higher mobility than the first material of the cocktail layer 112 due to a weaker bond energy and an increase in metal ions in the second material. Thus, mobile charge carriers may have a higher mobility at an interface between the second material of the cocktail layer 112 and the gate dielectric layer 108. Therefore, the cocktail layer 112 comprises a mixture of the first and second materials to reduce defects but also increase charge mobility at an interface between the bottommost layer 110*b* of the active structure 110 and the gate dielectric layer 108.

Figure 10:
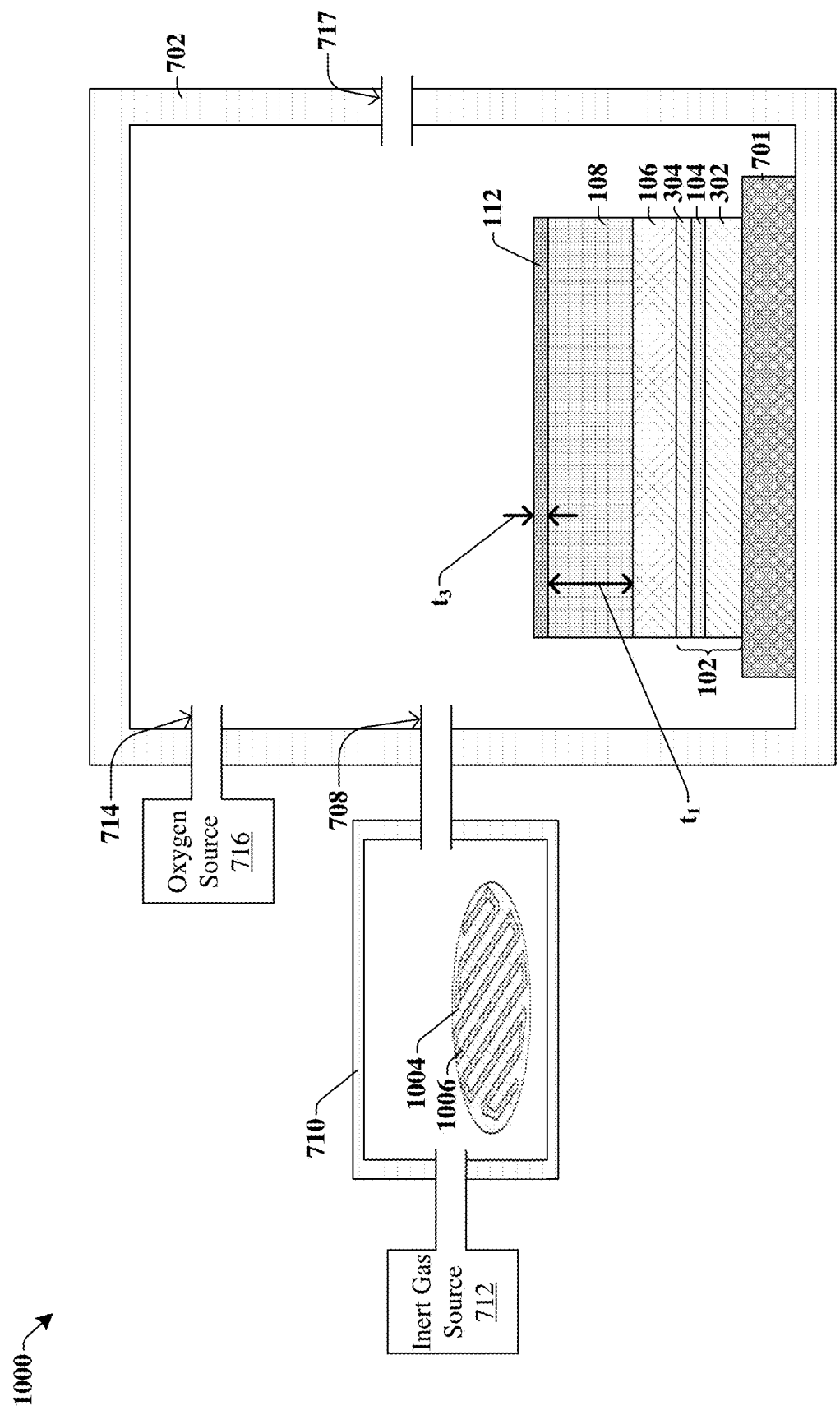

As shown in cross-sectional view 1000 of FIG. 10, in some embodiments, a fourth precursor plate 1004 is placed in the first precursor vessel defined by the first vessel housing 710. It will be appreciated that FIG. 10 may proceed from FIG. 9A or FIG. 9B. In some other embodiments, the fourth precursor plate 1004 may be arranged in a third precursor vessel (not shown) separate from the first and second precursors. In some embodiments wherein there is a first vessel housing 710 and a second vessel housing (718 of FIG. 9B) as illustrated in FIG. 9B, the second vessel housing (718 of FIG. 9B) is emptied and/or closed off, such that the inert gas source 712 will only activate a third solid precursor 1006 arranged within the fourth precursor plate 1004. In some embodiments, the third solid precursor 1006 may comprise zinc or some other metal. In some embodiments, the third solid precursor 1006 comprises, for example, $Zn(CH_3COO)_2$, diethylzinc, dimethylzinc, zinc acetate, $(CH_3)Zn(OCH(CH_3)_2)$, or some other suitable solid precursor.

Figure 11:
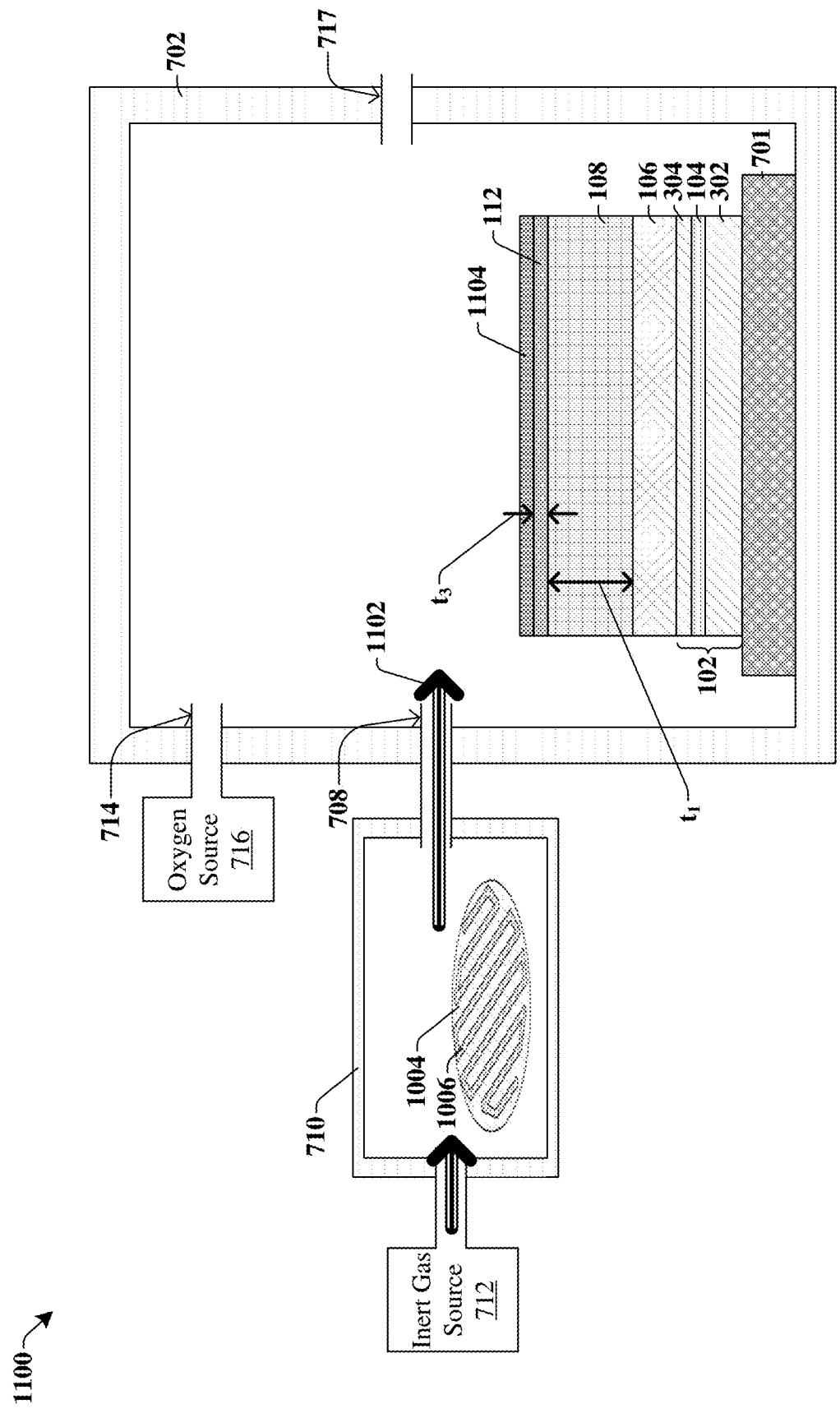

As shown in cross-sectional view 1100 of FIG. 11, in some embodiments, the inert gas source 712 is turned "ON," as indicated by arrows 1102, and reacts with the third solid precursor 1006 within the first precursor vessel. In some such embodiments, a third precursor vapor forms and enters the reaction chamber to form a second metal layer 1104 over the cocktail layer 112 by ALD.

Figure 12:
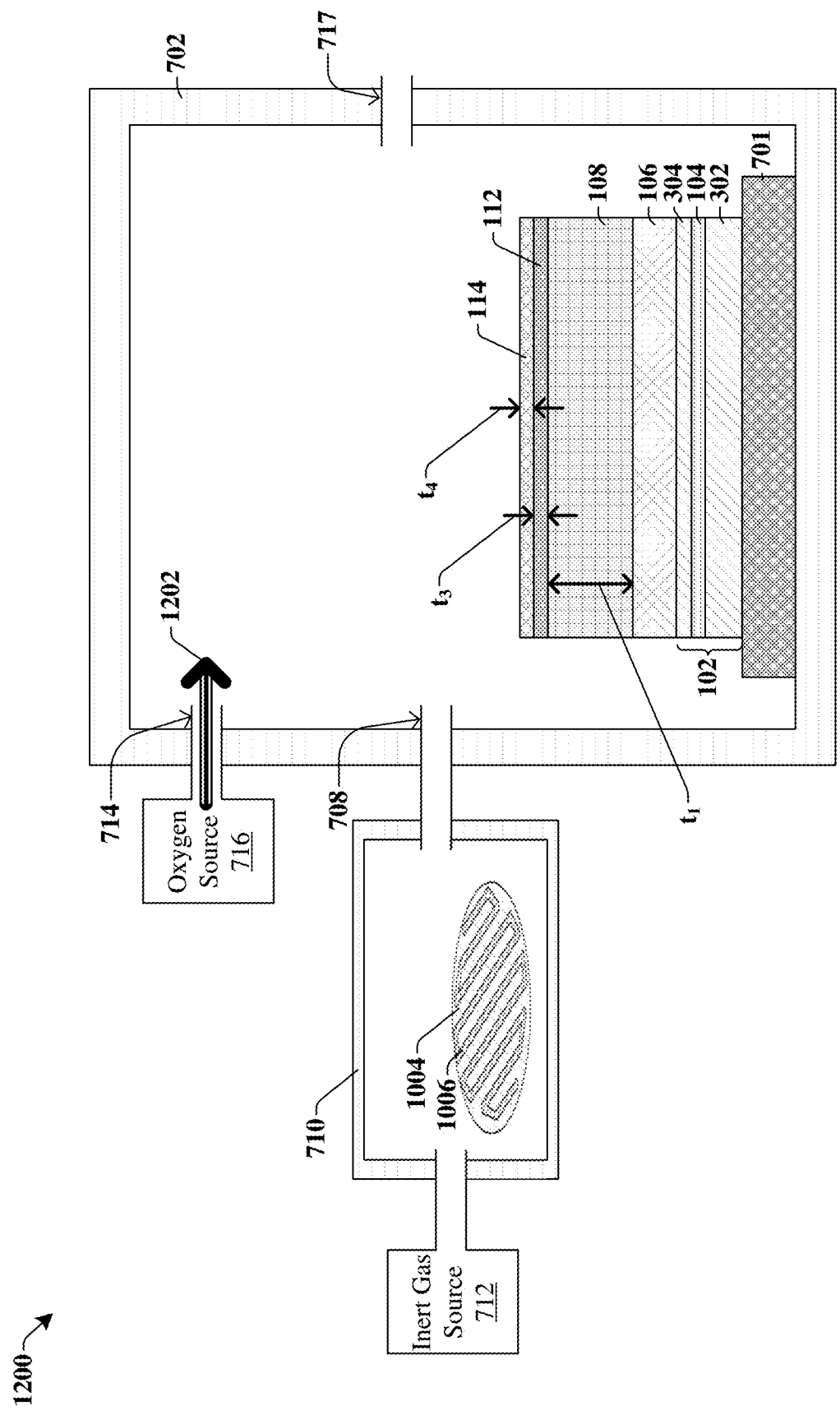

As shown in cross-sectional view 1200 of FIG. 12, in some embodiments, the oxygen source 716 is turned "ON," as indicated by arrow 1202, and an oxygen vapor enters the reaction chamber. In some such embodiments, the oxygen vapor then reacts and oxidizes with the second metal layer (1104 of FIG. 11) to form a first active layer 114 over the cocktail layer 112. In some other embodiments, the second precursor vapor of FIG. 11 enters the reaction chamber and then the oxygen vapor enters the reaction chamber and reacts with the second precursor vapor to form the first active layer 114, thereby bypassing the formation of the second metal layer (1104 of FIG. 11). In some embodiments, the first active layer 114 has a fourth thickness $t_4$ in a range of between, for example, approximately 0.1 angstroms to approximately 500 angstroms.

Nevertheless, in some embodiments, the first active layer 114 comprises a third material different than the first and second materials, such as, for example, zinc oxide, or some other suitable metal oxide. In some embodiments, the first and second materials of the cocktail layer 112 and the third material of the first active layer 114 together form a semiconductor material such as, for example, indium gallium zinc oxide (IGZO), tin gallium zinc oxide, or some other suitable metal oxide semiconductor material. In some embodiments, the first active layer 114 is spaced apart from the gate dielectric layer 108 by the cocktail layer 112 because the first active layer 114 has a more crystalline structure than the cocktail layer 112. Thus, the first active layer 114 is spaced apart from the gate dielectric layer 108 to avoid potential adhesion and structural issues on the gate dielectric layer 108.

FIGS. 13A and 13B illustrates timing diagrams 1300A and 1300B, respectively, of some embodiments of forming the cocktail layer (112 of FIG. 12) over the gate dielectric layer (108 of FIG. 12) and the first active layer (114 of FIG. 12) over the cocktail layer (112 of FIG. 12). The timing diagrams 1300A and 1300B illustrate increase in gas pressure to activate various precursors versus time. The timing diagrams 1300A and 1300B include a legend 1302 that illustrates the activation of precursors. In some embodiments, the time period of each gas pulse may be in a range of between, for example, approximately 1 millisecond to approximately 20 minutes.

FIG. 13A illustrates the timing diagram 1300A of some embodiments corresponding to the first method, comprising a solid precursor mixture (706 of FIG. 7A) as illustrated in FIGS. 7A, 8A, 9A, 10, 11 and 12.

As shown in the timing diagram 1300A of FIG. 13A, in some embodiments, the inert gas source (712 of FIG. 8A) is turned "ON" first to activate the solid precursor mixture (706 of FIG. 8A) which corresponds to the steps in FIG. 8A. Then, the oxygen source (716 of FIG. 9A) is turned "ON" after the inert gas source (712 of FIG. 8A) to introduce oxygen vapor into the reaction chamber to form the cocktail layer (112 of FIG. 9A) which corresponds to the steps in FIG. 9A. In some embodiments, then, the inert gas source (712 of FIG. 11) is again turned "ON" to activate the third solid precursor (1006 of FIG. 11) to introduce a third precursor vapor into the reaction chamber which corresponds to the steps of FIG. 11. Then, in some embodiments, the oxygen source (716 of FIG. 9A) is turned on to introduce oxygen vapor into the reaction layer to form the first active layer (114 of FIG. 12) which corresponds to the steps in FIG. 12.

FIG. 13B illustrates the timing diagram 1300B of some embodiments corresponding to the second method, comprising a first solid precursor (722 of FIG. 7B) and a second solid precursor (726 of FIG. 7B) as illustrated in FIGS. 7B, 8B, 9B, 10, 11, and 12.

As shown in the timing diagram 1300B of FIG. 13B, in some embodiments, the inert gas source (712 of FIG. 8B) is turned "ON" first to activate the first solid precursor (722 of FIG. 8B) and the second solid precursor (726 of FIG. 8B) at the same time which corresponds to the steps in FIG. 8B. Then, the oxygen source (716 of FIG. 9B) is turned "ON" after the inert gas source (712 of FIG. 8B) to introduce oxygen vapor into the reaction chamber to form the cocktail layer (112 of FIG. 9B) which corresponds to the steps in FIG. 9B. In some embodiments, then, the inert gas source (712 of FIG. 11) is again turned "ON" to activate the third solid precursor (1006 of FIG. 11) to introduce a third precursor vapor into the reaction chamber which corresponds to the steps of FIG. 11. Then, in some embodiments, the oxygen source (716 of FIG. 9A) is turned on to introduce oxygen vapor into the reaction layer to form the first active layer (114 of FIG. 12) which corresponds to the steps in FIG. 12.

In some embodiments, as shown in FIGS. 13A and 13B, the gas pulses do not overlap with one another, besides the activation of the first and second solid precursors (722, 726 of FIG. 8B) in FIG. 13B. In some other embodiments, it will be appreciated that the gas pulses may overlap with one another. For example, in some embodiments, as the inert gas source (712 of FIG. 8B) is not completely "OFF," the oxygen source (716 of FIG. 9B) may turn "ON" such that the gas pulses corresponding to FIG. 8B may partially overlap with the gas pulse of FIG. 9B.

Figure 14:
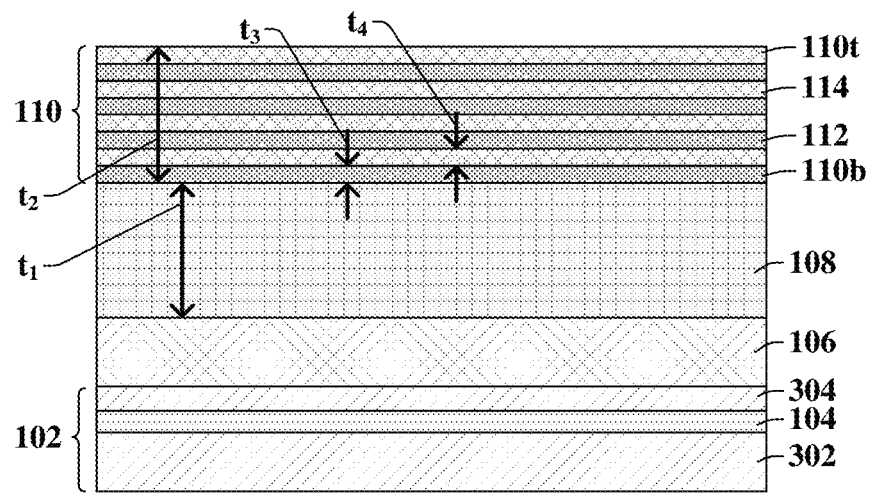

As illustrated in cross-sectional view 1400 of FIG. 14, in some embodiments, the steps in FIGS. 8A-12 are repeated to form multiple cocktail layers 112 and first active layers 114 over the gate dielectric layer 108. Thus, in some embodiments, an active structure 110 comprising a stack of the cocktail layers 112 and first active layers 114 in alternating order are arranged over the gate dielectric layer 108. In some embodiments, the active structure 110 has a second thickness $t_2$ that is in a range of between, for example, approximately 5 nanometers and approximately 15 nanometers. A bottommost layer 110b of the active structure 110 comprises one of the cocktail layers 112. However, in some embodiments, a topmost layer 110t of the active structure 110 may comprise one of the cocktail layers 112 or one of the first active layers 114. It will be appreciated that in some other embodiments, there may be more or less than 8 layers in the active structure 110.

Figure 15:
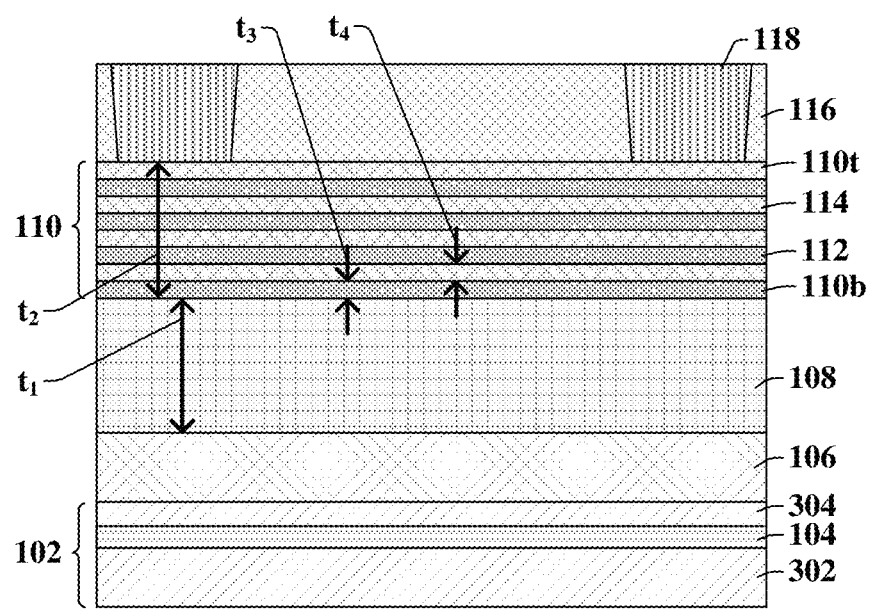

As illustrated in cross-sectional view 1500 of FIG. 15, in some embodiments, source/drain contacts 118 are formed over the active structure 110. In some embodiments, the source/drain contacts 118 are formed within an interconnect dielectric layer 116 arranged over the active structure 110 through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching). In some other embodiments, the source/drain contacts 118 are formed first, and then the interconnect dielectric layer 116 is formed between the source/drain contacts 118 and over the active structure 110.

In some embodiments, the interconnect dielectric layer 116 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the source/drain contacts 118 comprise, for example, aluminum, tungsten, copper, tantalum, titanium, or some other suitable conductive material.

Further, in some embodiments, after the formation of the source/drain contacts 118, a post deposition annealing process is to recrystallize the gate dielectric layer 108 to enhance the polarization states of the gate dielectric layer 108 used to store memory. In some embodiments, the post deposition annealing process is performed in chamber set to a temperature of between, for example, about 300 degrees Celsius and about 500 degrees Celsius for a time period in a range of between, for example approximately 30 seconds and approximately 90 seconds.

In some embodiments, the overall structure formed in FIG. 15 is a thin film transistor (TFT) that is also a field effect transistor (FET) ferroelectric random access memory (FeRAM) device. In some such embodiments, when sufficient signals (e.g., current, voltage) are applied to the source/drain contacts 118 and the gate electrode 106, a channel region may form in the active structure 110 and near the interface of the active structure 110 and the gate dielectric layer 108 that can read memory from or write memory too the gate dielectric layer 108. Because the cocktail layer 112 comprising a mixture of the first and second materials directly contacts the gate dielectric layer 108, defects are reduced and charge mobility is increased which increases the reliability and switching speeds of the overall FET FeRAM.

Figure 16:
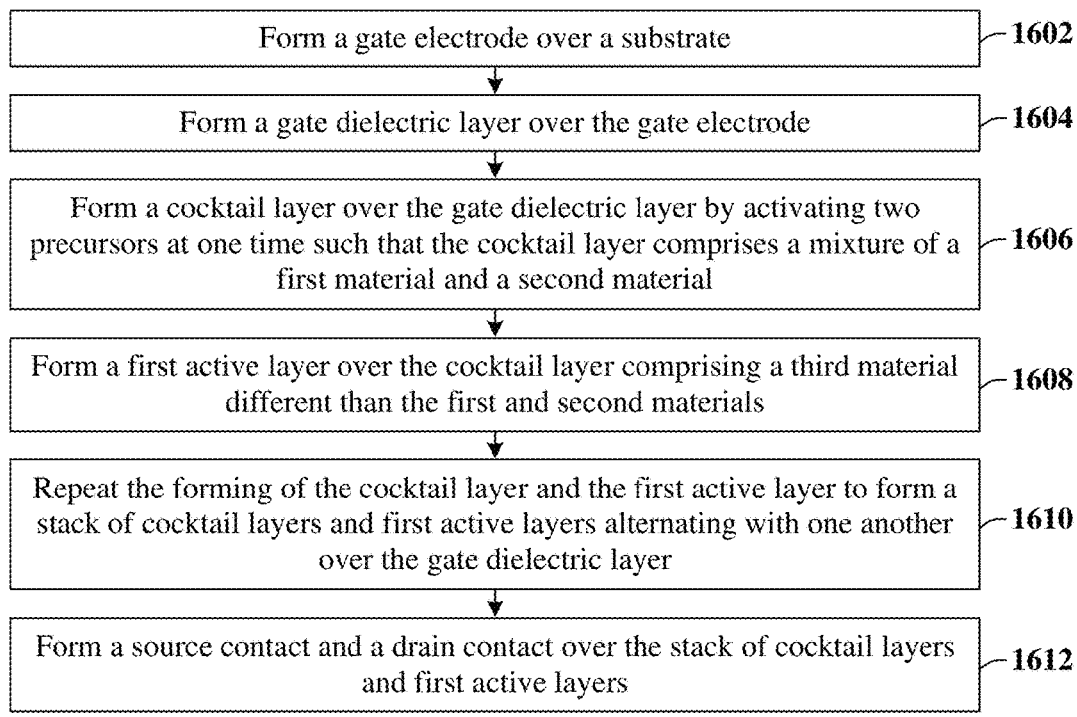
FIG. 16 illustrates a flow diagram of some embodiments of methods of forming a cocktail layer in a FET FeRAM that corresponds to the methods illustrated in FIGS. 5-15.

FIG. 16 illustrates a flow diagram 1600 of some embodiments corresponding to the methods illustrated in FIGS. 5-15.

While method in flow diagram 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a gate electrode is formed over a substrate. FIG. 5 illustrates a cross-sectional view 500 of some embodiments corresponding to act 1602.

At act 1604, a gate dielectric layer is formed over the gate electrode. FIG. 6 illustrates a cross-sectional view 600 of some embodiments corresponding to act 1604.

At act 1606, a cocktail layer is formed over the gate dielectric layer by activating two precursors at one time such that the cocktail layer comprises a mixture of a first material and a second material. FIGS. 8A and 9A illustrates cross-sectional views 800A and 900A, respectively, of some embodiments corresponding to act 1606.

At act 1608, a first active layer is formed over the cocktail layer and comprises a third material different than the first and second materials. FIGS. 11 and 12 illustrate cross-sectional views 1200 and 1300, respectively, of some embodiments corresponding to act 1608.

At act 1610, the forming of the cocktail layer and the first active layer is repeated to form a stack of cocktail layers and first active layers alternating with one another over the gate dielectric layer. FIG. 14 illustrates a cross-sectional view 1400 of some embodiments corresponding to act 1610.

At act 1612, a source contact and a drain contact are formed over the stack of cocktail layers and first active layers. FIG. 15 illustrates a cross-sectional view 1500 of some embodiments corresponding to act 1612.

Therefore, the present disclosure relates to a method of forming cocktail layer comprising a mixture of two materials directly on a ferroelectric layer of a FET FeRAM to optimize mobility and surface state properties of the cocktail layer and the ferroelectric layer to optimize switching speeds and reliability of the FET FeRAM.

Accordingly, in some embodiments, the present disclosure relates to an integrated chip, comprising: a gate electrode arranged over a substrate; a gate dielectric layer arranged over the gate electrode; an active structure arranged over the gate dielectric layer and comprising a stack of cocktail layers alternating with first active layers, wherein the cocktail layers comprise a mixture of a first material and a second material, wherein the first active layers comprise a third material different than the first and second materials, and wherein a bottommost layer of the active structure is one of the cocktail layers; and a source contact and a drain contact arranged over the active structure.

In other embodiments, the present disclosure relates to an integrated chip comprising: a gate electrode arranged over a substrate; a gate dielectric layer arranged over the gate electrode, wherein the gate dielectric layer comprises a ferroelectric material; an active structure arranged over the gate dielectric layer and comprising a first material, a second material that is different than the first material, and a third material that is different than the first and second materials, wherein the first material and the second material directly contact the gate dielectric layer, and wherein the third material is spaced apart from the gate dielectric layer by the first and second materials; and a source contact and a drain contact arranged over the active structure.

In yet other embodiments, the present disclosure relates to a method comprising: forming a gate electrode over a substrate; forming a gate dielectric layer over the gate electrode; forming a cocktail layer over the gate dielectric layer by activating two precursors at one time such that the cocktail layer comprises a mixture of a first material and a second material; forming a first active layer over the cocktail layer comprising a third material different than the first and second materials; and forming a source contact and a drain contact over the cocktail layer and the first active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate electrode over a substrate;
   forming a gate dielectric layer over the gate electrode;
   forming a cocktail layer over the gate dielectric layer, wherein of the forming of the cocktail layer comprises activating two precursors at one time, and wherein the cocktail layer is formed comprising a mixture of a first material and a second material;
   forming a first active layer over the cocktail layer, the first active layer comprising a third material different than the first and second materials; and
   forming a source contact and a drain contact over the cocktail layer and the first active layer;
   wherein the activating generates a vapor comprising a first element and a second element respectively from the two precursors, and wherein the first and second materials are semiconductor materials formed respectively comprising the first element from the vapor and the second element from the vapor.

2. The method of claim 1, wherein the two precursors are solid precursors mixed together within a same precursor vessel.

3. The method of claim 1, wherein the two precursors are solid precursors, wherein a first precursor is in a first precursor vessel, wherein a second precursor is in a second precursor vessel, and wherein one or more gas sources activate the first and second precursors at a same time.

4. A method comprising:
   forming a gate electrode and a channel layer stacked over a substrate, wherein the channel layer comprises a cocktail layer and an active layer overlying the cocktail layer, and wherein the forming of the channel layer comprises:
   arranging the substrate within a process chamber;
   adding a composite precursor vapor into the process chamber to concurrently deposit a first metal and a second metal, wherein the first metal forms from a first precursor vapor of the composite precursor vapor, and wherein the second metal forms from a second precursor vapor of the composite precursor vapor mixed with the first precursor vapor; and
   oxidizing the first and second metals into the cocktail layer; and
   forming a source region and a drain region respectively on opposite sides of the gate electrode.

5. The method according to claim 4, wherein the first metal is indium, and wherein the second metal is gallium.

6. The method according to claim 4, wherein the active layer is crystalline and has higher crystallinity than the cocktail layer.

7. The method according to claim 4, wherein the forming of the channel layer comprises:
   flowing an inert gas over a solid precursor mixture, wherein the solid precursor mixture comprises a first solid precursor configured to form the first precursor vapor and a second solid precursor configured to form the second precursor vapor, wherein the first and second solid precursors are mixed in the solid precursor mixture, and wherein the flowing concurrently forms the first and second precursor vapors and mixes the first and second precursor vapors into the composite precursor vapor.

8. The method according to claim 4, wherein the forming of the channel layer comprises:
   flowing an inert gas over a first solid precursor to generate the first precursor vapor;

flowing the inert gas over a second solid precursor to generate the second precursor vapor; and mixing the first precursor vapor and the second precursor vapor to generate the composite precursor vapor;

wherein the first and second solid precursors are on separate precursor plates in separate vessel housings.

9. The method according to claim 4, wherein the forming of the channel layer comprises:

adding a third precursor vapor into the process chamber to deposit a third metal on the cocktail layer; and oxidizing the third metal into the active layer.

10. The method according to claim 4, wherein the channel layer comprises a plurality of cocktail layers, including the cocktail layer, stacked with each other, and wherein the forming of the channel layer comprises repeatedly performing the adding and the oxidizing.

11. A method comprising:

depositing a gate electrode layer overlying a substrate;

depositing a gate dielectric layer overlying the gate electrode layer;

forming a channel layer overlying the gate dielectric layer, wherein the forming of the channel layer comprises:

depositing a composite metal oxide layer comprising a first metal oxide and a second metal oxide that are intermixed; and depositing a metal oxide layer overlying the composite metal oxide layer and comprising a third metal oxide; and forming a source contact and a drain contact laterally separated from each other and extending from the channel layer.

12. The method according to claim 11, wherein the depositing of the composite metal oxide layer is performed by atomic layer deposition (ALD) using different precursor gases that are intermixed and that are respectively configured to deposit metal of the first metal oxide and metal of the second metal oxide.

13. The method according to claim 12, wherein the different precursor gases are concurrently generated from a common solid precursor.

14. The method according to claim 12, wherein the different precursor gases are generated from separate solid precursors.

15. The method according to claim 11, wherein the first metal oxide is indium oxide, the second metal oxide is gallium oxide, and the third metal oxide is zinc oxide.

16. The method according to claim 11, wherein the first metal oxide has a stronger bonding energy compared to the second metal oxide, and wherein the second metal oxide has a higher charge mobility compared to the first metal oxide.

17. The method according to claim 11, wherein the forming of the channel layer comprises repeatedly depositing the composite metal layer and the metal oxide layer.

18. The method according to claim 1, wherein the first and second elements are metals, and wherein the two precursors respectively comprise the first and second elements.

19. The method according to claim 18, wherein the forming of the cocktail layer further comprises:

exposing the gate dielectric layer to the vapor to deposit a metal layer comprising the first and second elements intermixed; and oxidizing the metal layer into the cocktail layer.

20. The method according to claim 1, wherein the third material is a semiconductor material, and wherein the third material has higher crystallinity than the first and second materials and overlies the cocktail layer, completely spaced from the gate dielectric layer by the cocktail layer.

* * * * *